(12) United States Patent
Yoshida et al.

(10) Patent No.: US 6,178,620 B1
(45) Date of Patent: *Jan. 30, 2001

(54) ELECTRONIC COMPONENT FEEDING APPARATUS

(75) Inventors: Yoshihiro Yoshida, Neyagawa; Kanji Hata, Katano; Naoyuki Kitamura, Hirakata, all of (JP)

(73) Assignee: Matsushita Electric Industrial Co., Ltd., Osaka-fu (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/893,104

(22) Filed: Jul. 15, 1997

(30) Foreign Application Priority Data

Jul. 19, 1996 (JP) .................................................. 8-190604

(51) Int. Cl.[7] ...................................................... H05K 3/30
(52) U.S. Cl. ................................. 29/740; 29/741; 29/832
(58) Field of Search ............................... 29/832, 840, 740, 29/564.1, 564, 569.2, 741

(56) References Cited

U.S. PATENT DOCUMENTS

| | | | | |
|---|---|---|---|---|
| 4,438,559 | * | 3/1984 | Asai et al. | 29/740 |
| 4,610,083 | * | 9/1986 | Campisi et al. | 29/740 X |
| 4,670,976 | * | 6/1987 | Stridsberg et al. | 29/740 |
| 4,768,915 | * | 9/1988 | Fujioka | 29/740 X |
| 4,952,113 | * | 8/1990 | Fujioka | 29/740 X |
| 5,299,902 | * | 4/1994 | Fujiwara et al. | 29/740 X |
| 5,539,977 | * | 7/1996 | Kano et al. | 29/740 X |
| 5,628,107 | * | 5/1997 | Nushiyama et al. | 29/740 |

\* cited by examiner

*Primary Examiner*—I Cuda Rosenbaum
*Assistant Examiner*—Rick Kiltae Chang
(74) *Attorney, Agent, or Firm*—Price and Gess

(57) ABSTRACT

A transmission mechanism includes a pressing stroke controller for changing the effective pressing stroke of each feed lever of a component feeder unit corresponding to a predetermined pitch of carrying electronic components in respective component feeder unit, whereby the vibration generated when the transmission mechanism is in operation is reduced. Adverse effects on a component feeder unit having small components thereon at a fine pitch which is susceptible to the vibration will be prevented, and the feeding speed can be increased to be more productive.

21 Claims, 5 Drawing Sheets

ELECTRONIC COMPONENT FEEDING APPARATUS

BACKGROUND OF THE INVENTION

1. Field of the Invention

The present invention relates to an electronic component feeding apparatus for feeding electronic components to an electronic component mounting apparatus.

2. Description of Related Art

Electronic components in the form of chips constituting electronic circuits (hereinafter referred to as electronic components) have recently come into wide use, and as there have been more and more various types of electronic components, the number of type and quantity of electronic components mounted on one electronic circuit has been increased. Such a variety of electronic components are mounted in certain combinations onto a printed circuit board with the use of an electronic component mounting apparatus. To feed the electronic components to the electronic component mounting apparatus at desired timings, an electronic component feeding apparatus is desired to operate at a high speed and to be highly reliable.

A conventional electronic component feeding apparatus will be explained by referring to FIGS. 4 to 6.

Referring to FIG. 4, component feeder units 1 of the conventional electronic component feeding apparatus conveys electronic components assemblies 2 intermittently in a direction of (b) at regular intervals of a given pitch by reciprocating pivotal movements of a feed lever 4, each of the electronic components assemblies 2 accommodating a row of electronic components 7 held on a tape-like carrier (FIG. 6). A plurality of component feeder units 1 are loaded on a component supply table 3 in such a way that the component supply units 1 can be moved in a direction of (a) to be transferred to a feeding position (d) shown in FIG. 5. The feed lever 4 of the component feeder unit 1 which is brought to locate at the feeding position (d) is driven by a transmission mechanism 41.

The component feeder unit 1 includes a frame structure 31 having a mounting unit for anchoring it to the component supply table 3, and a loading unit 32 for loading the tape-like electronic components assembly 2 thereon, and a guide 36 for guiding the electronic components assembly 2. The feed lever 4 is pivotally mounted around an axial point 34 on the frame structure 31 and is driven by the pressing action of the transmission mechanism 41 for swinging motion between a lower limit of a pressing roller 42 of the transmission mechanism 41 and an upper limit thereof defined by an upper stopper (not shown). The component feeder unit 1 is further provided with a reel-out unit 33 for intermittently feeding the electronic components assembly 2 in the forward direction (b) via a link 37 by the reciprocating motion of the feed lever 4 and a separating unit 38 for peeling off and taking up a covering tape 20 (FIG. 6) from the electronic components assembly 2. A tape holder 5 retains the electronic components assembly 2 from lifting up after separation of the covering tape 20, and prevents the electronic components 7 from popping out therefrom, having a shutter 6 disposed at its tip where the electronic components 7 are picked up, which opens and closes in synchronism with the reciprocating swing motion of the feed lever 4.

The feed lever 4 has a spring (not shown) upwardly urging a contacting portion 16 at the upper end of the feed lever 4, by which the feed lever 4 remains in pressed contact with the upper stopper when the contacting portion 16 is disengaged from the pressing roller 42. The stroke of the reciprocating swing motion of the contacting portion 16 between its upper and lower limits is the length of an effective stroke which is defined by the pitch for intermittently feeding the electronic components assembly 2 in the forward direction (b). The component supply table 3 carries a plurality of the component feeder units 1, each having different effective strokes of the feed lever 4.

The transmission mechanism 41 comprises a driving arm 43 for swinging movements along a direction of (e), the pressing roller 42 mounted at the distal end of the driving arm 43 for pressing down the contacting portion 16 of the feed lever 4, and a driving means (not shown) for carrying the driving arm 43 to reciprocate in a swing motion at a predetermined swinging angle. The pressing roller 42 is driven at a constant stroke of the pressing motion.

The procedure of feeding the components in such an electronic component feeding apparatus will now be explained.

Referring to FIGS. 3 and 4, the effective stroke of each feed lever 4 is preliminarily set corresponding to respective feeding pitch of the electronic components assembly 2 for conveying the electronic components 7. The effective stroke for each feed lever 4 is differently set in respective component feeder unit 1 by adjusting the position of the stopper which defines the upper limit, while the lower limit is set to be a fixed position of the lower dead point of the pressing roller 42 for all the component feeder units 1. In particular, the upper limit of the feed lever 4 is set to a higher position for a component feeder unit 1 having a greater feeding pitch, i.e., the effective stroke, as can be seen from the vertical motion of the feed lever ② shown by a double-dotted chain line in FIG. 3. And the upper limit of the feed lever 4 is set to a lower position for a component feeder unit 1 having a shorter effective stroke, as can be seen from the vertical motion of the feed lever ① shown by a solid line in FIG. 3.

As the pressing roller 42 is lowered, it comes into direct contact with the contacting portion 16 of the feed lever 4 located at its upper limit and presses it down by the length of the effective stroke until its lower limit. When the feed lever 4 is returned upward by the yielding force of the spring together with the pressing roller 42, the electronic components assembly 2 is advanced by the predetermined pitch along the direction (b). The electronic components assembly 2 is guided into the tape holder 5, after its covering tape 20 is peeled off at the separating unit 38 before the shutter 6. The lower limits of the pressing roller 42 and the feed lever 4 are set to be identical for all the component feeder units 1, as described above and as can be seen from the vertical motion of the pressing roller ①② shown by solid and broken lines in FIG. 3.

The operation of the shutter 6 is linked to the vertical movements of the feed lever 4, and the shutter 6 opens and closes as the feed lever 4 descends and ascends, respectively. A nozzle C of the electronic component mounting apparatus B is lowered as the shutter 6 opens and picks up an electronic component 7 under the opened shutter 6 by a sucking action. The nozzle C is lifted before the shutter 6 is closed and transfers the electronic component 7 to a mounting position for mounting it on a printed circuit board A.

While the pressing roller 42 stays at its upper dead point, the component supply table 3 conveys the component feeder unit 1 loaded with a desired type of electronic components 7 to the feeding position (d). By repeating these actions, the electronic component feeding apparatus supplies a set of electronic components 7 to the electronic component mounting apparatus B according to a predetermined program.

When the transmission mechanism 41 is placed in operation, specifically when the descending pressing roller 42 comes into direct contact with the contacting portion 16 of the feed lever 4, a certain amount of vibration is generated caused by the impact of collision. The amount of vibration depends greatly on the rate of the pressing roller 42 hitting against the contacting portion 16. The speed is, however, fixedly set irrespective of types of the component feeder units 1 having different sizes of components and feeding pitches as shown in FIG. 3.

The electronic components 7 accommodated in the electronic components assembly 2 of which feeding pitch is small are generally light weighted and are more affected by the vibration caused by the impact. When the transmission mechanism 41 is operated at a higher speed in case that a component feeder unit 1 having small feeding pitch and the one having a greater feeding pitch are carried on the component supply table 3, the electronic component 7 positioned at the shutter 6 of the component feeder unit 1 with a small feeding pitch receives a greater shock by the hitting rate of the feed lever 4, causing the electronic component 7 to bounce or jump out of the place while the shutter 6 is opened. This causes the nozzle C of the electronic component mounting apparatus B to fail in picking up the electronic component 7, to drop the electronic component 7 during the transfer by insufficient sucking force, or to mount the electronic component 7 at an incorrect position.

The speed of feeding the electronic components 7 can thus be only increased up to a limited degree which is defined by the effects of the vibration to a light weighted type electronic components.

BRIEF SUMMARY OF THE INVENTION

In view of the foregoing, it is an object of the present invention to provide an electronic component feeding apparatus capable of effectively feeding components at high speed without having adverse effects on a component feeder unit accommodating small components in a row at a small pitch, by reducing the vibration generated when the transmission mechanism is in operation, even when various types of the component feeder units accommodating different components at different pitches are loaded on the same feeder table.

To accomplish said object, an electronic component feeding apparatus of the present invention comprises component feeder units, each including an electronic components assembly accommodating a row of electronic components held on a tape-like carrier at regular intervals of a predetermined pitch, and a feed lever for intermittently feeding the electronic components assembly by reciprocating swing movements thereof, a component supply table loaded with the component feeder units to be transferred to a feeding position, and a transmission mechanism for driving the feed lever of the component feeder unit brought to locate at the feeding position, in which the transmission mechanism comprises a pressing stroke controller for changing the pressing stroke of the effective stroke of each feed lever corresponding to the predetermined pitch in respective component feeder unit.

According to the electronic component feeding apparatus of the present invention, the pressing stroke of the transmission mechanism can be adjusted to match the effective stroke of the feed lever required in each component feeder unit. Consequently, the speed of a pressing member of the transmission mechanism at the moment when it hits a contacting surface of the feed lever can be reduced without slowing down the feeding speed, thereby the vibration generated on impact. It is thus attainable to increase the operation rate even when various types of component feeder units with different pitches including the one accommodating minute components at a fine pitch which is susceptible to the vibration are carried by the same component supply table.

DETAILED DESCRIPTION OF PREFERRED EMBODIMENTS

Preferred embodiments of the present invention will be described referring to the accompanying drawings.

Figure 1:
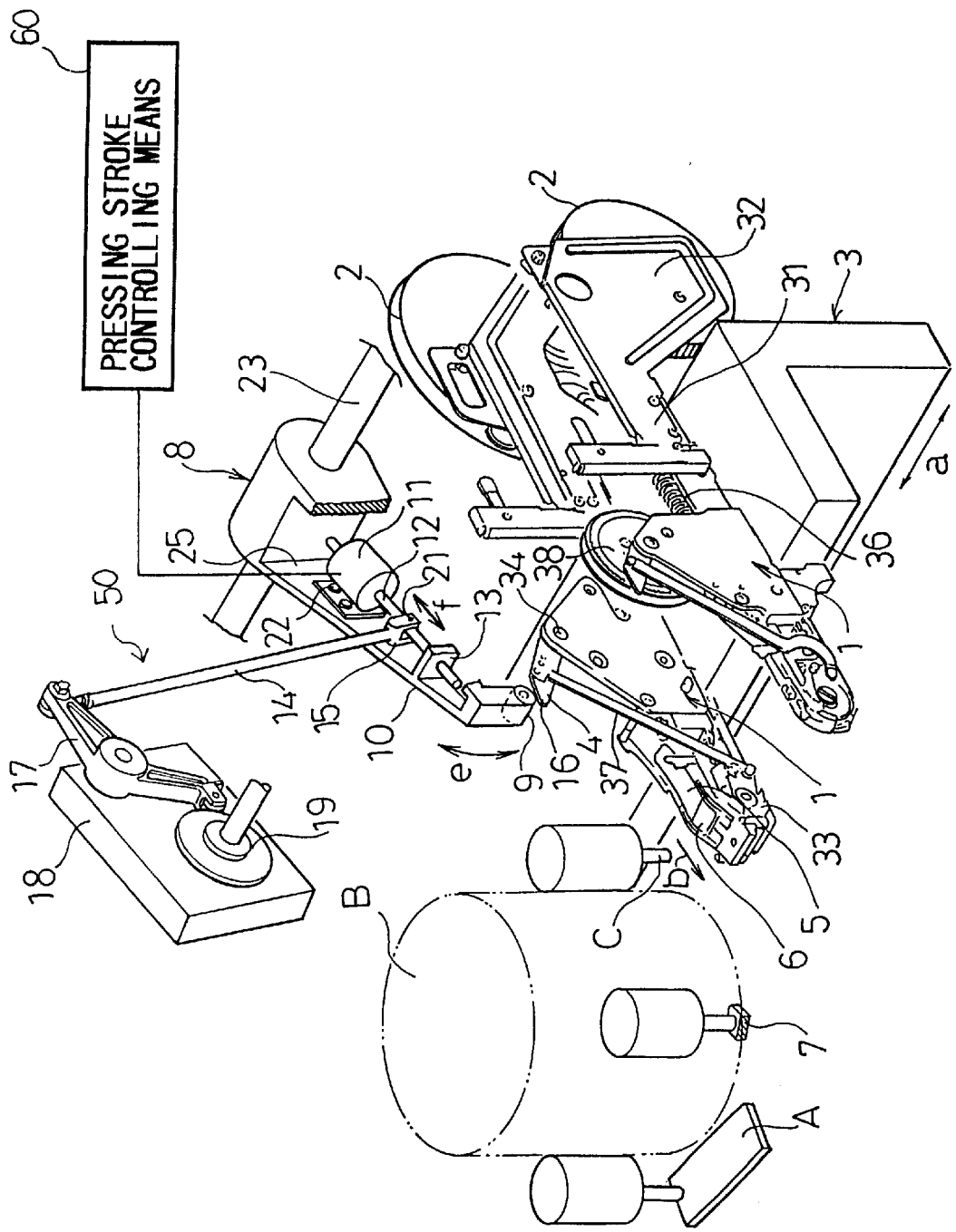
FIG. 1 is a partially cut-off perspective view showing an electronic component feeding apparatus of the present invention.

As shown in FIG. 1, an electronic component feeding apparatus of the present invention comprises a plurality of component feeder units 1 which include electronic components assemblies 2 conveyed in a direction of an arrow (b) at regular intervals of a given pitch by means of reciprocating pivotal movements of a feed lever 4, each of the electronic components assemblies 2 accommodating a row of electronic components 7 held on a tape-like carrier. The component feeder units 1 are loaded on a component supply table 3 in such a way that the component feeder units 1 are movable in a direction of an arrow (a) to be transferred to a feeding position. A transmission mechanism 8 is provided for driving the feed lever 4 of each component feeder unit 1 being brought to locate at the feeding position.

Descriptions of the component feeder unit 1 and the component supply table 3 will be omitted as they are substantially identical to those of the conventional apparatus described above.

The transmission mechanism 8 shown in FIG. 1 comprises a driving arm 10 which is pivotally mounted around a rotating axis 23 for pressing down the feed lever 4 by various strokes for pressing, a pressing stroke controlling means 60 for controlling the stroke length of the driving arm 10, a cam 19 supported by a bracket 18 and driven by any driving means (not shown) to rotate, and a linking mechanism 50 for converting the rotation of the cam 19 into the pressing movements of the driving arm 10.

The driving arm 10 includes a pressing roller 9 mounted at its distal end for pressing the contacting portion 16 of the feed lever 4, and an encasement 25 which covers a linear servo motor 11 and the lowermost end 15 of a force transmitting rod 14 which is a part of the linking mechanism 50. The linear servo motor 11 is fixed by a mounting means 22 within the encasement 25. A movable rod 12 is arranged to have its axis crossed at right angles with the rotating axis 23 and supported in an axial aperture of the linear servo motor 11. The movable rod 12 can freely move in the axial direction (f) of itself. The movable rod 12 has its actuating point 21 where the lowermost end 15 of the rod 14 is rotatably connected to, and the actuating point is adjusted in the axial direction (f) by the linear motor controlled by the pressing stroke controlling means (not shown). A slide thrust 13 is provided on one side in the encasement 25 for supporting the movable rod 12 with the linear servo motor 11 on the other side, with the actuating point 21 being positioned therebetween, for prevention of deflection of the movable rod 12 in operation.

The pressing stroke controlling means comprises a memory means for storing control data applied to each component feeder unit 1, and a linear servo motor controlling means for outputting the corresponding control data to the linear servo motor, linking with the switching of the component feeder unit 1 being transferred by the component supply table 3 so that an automatic adjustment to accommodate the electronic component pitch can be accomplished for each feeder unit.

The linking mechanism 50 includes the rod 14 with its lowermost end 15 being connected to the actuating point 21 of the movable rod 12, and an arm 17 of substantially an L shape pivotally supported by the bracket 18 at its center, having one end contacted to the cam 19 and the other end movably connected to the uppermost end of the rod 14 so that the rotation of the cam 19 is converted into the reciprocal movements of the rod 14. It is preferable that the length of the rod 14 is greater than the moving range of the actuating point 21 in the axial direction (f), and the rod 14 crosses at nearly right angles with the movable rod 12, so that the height of the lower dead point of the driving arm 10 caused by the movements of the actuating point 21 along the direction (f) is varied by a small amount.

The transmission mechanism 8 changes the stroke of pressing by the function of the pressing stroke controlling means controlling the linear servo motor 11 in a manner to be described below. While the rod 14 actuated by the rotation of the cam 19 is reciprocated at a fixed rate of stroke, the pressing stroke of the pressing roller 9 varies in inverse proportion to the distance between the actuating point 21 and the rotating axis 23. The pressing stroke length is thus decreased when the actuating point 21 is shifted toward the distal end of the driving arm 10, and is increased when the actuating point 21 is moved toward the rotating axis 23.

Figure 2:
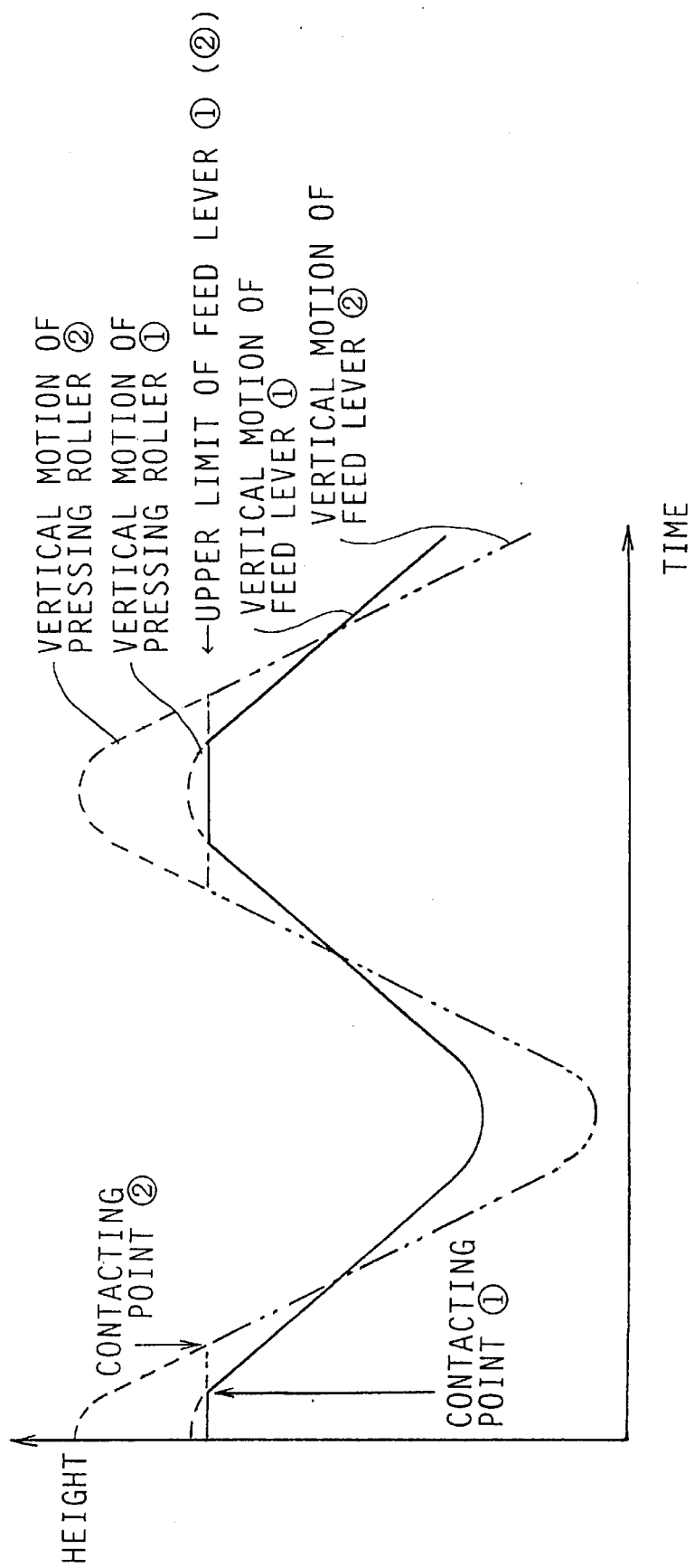
FIG. 2 is a diagram showing the changes in operation speed of a feed lever and a pressing roller which contact with each other in one embodiment of the present invention.
Figure 3:
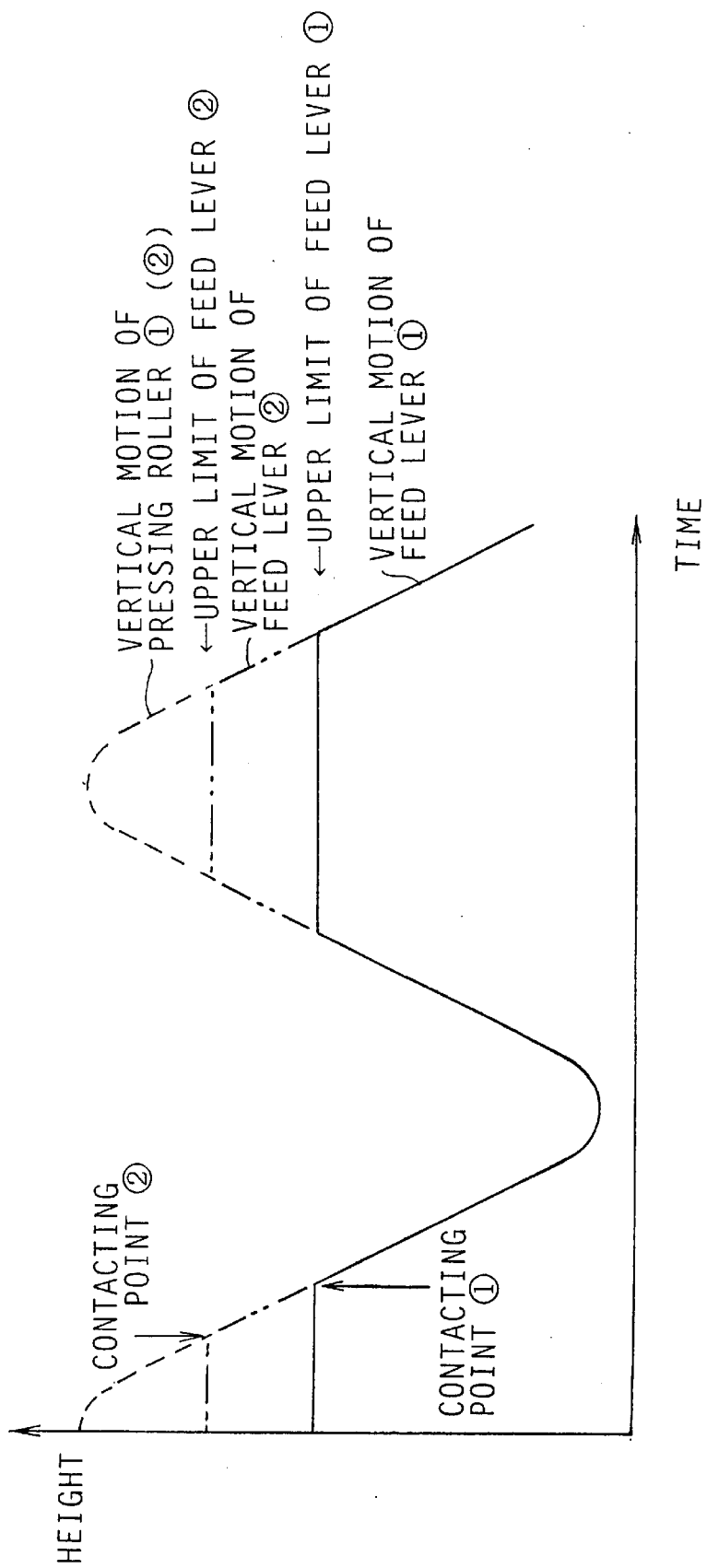
FIG. 3 is a diagram showing the changes in operation speed of a feed lever and a pressing roller which contact with each other in a conventional apparatus.
Figure 4:
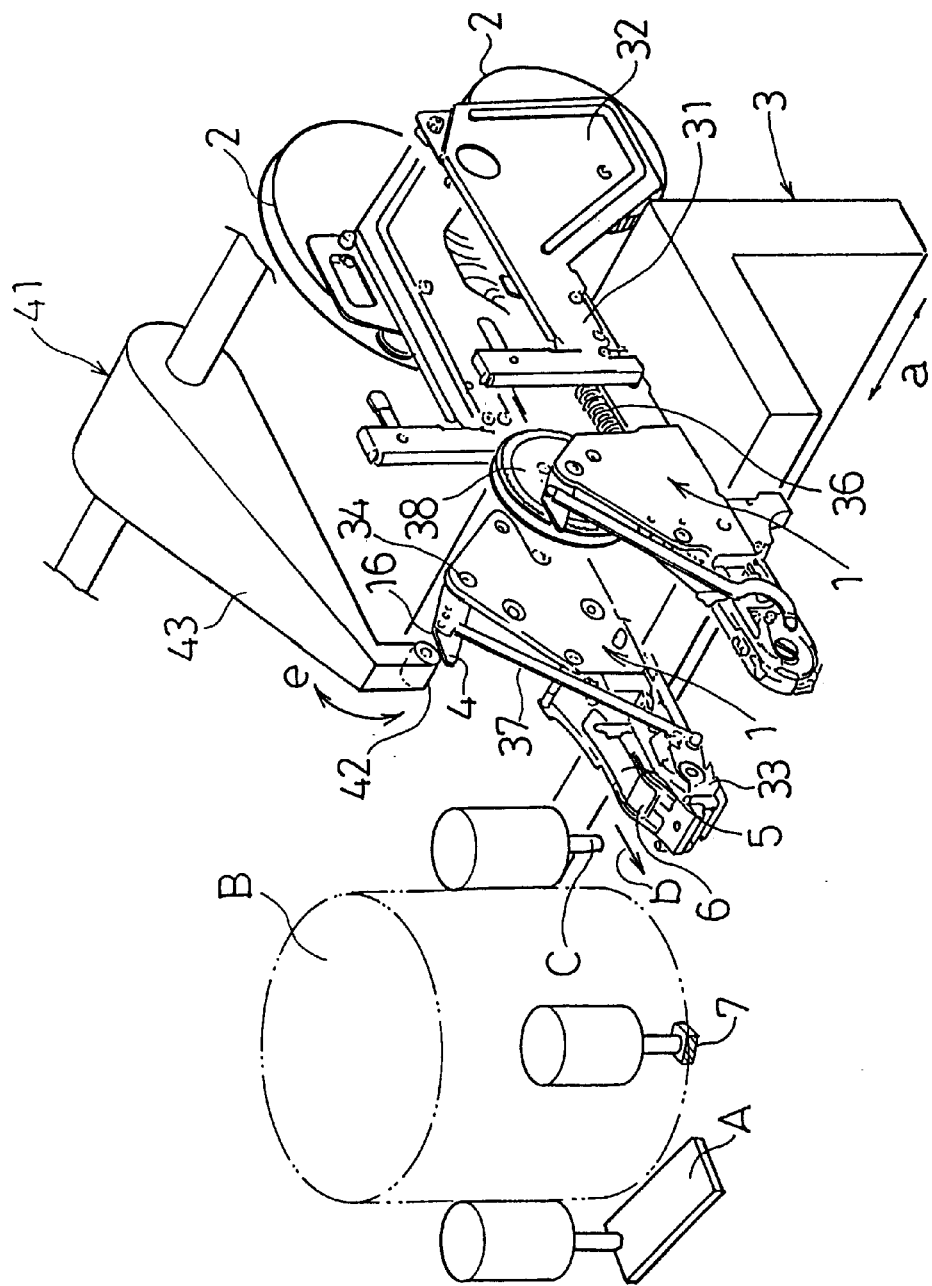
FIG. 4 is a perspective view showing an arrangement in a conventional electronic component feeding apparatus.

A procedure of feeding the components in the electronic component feeding apparatus of this embodiment will now be explained. In FIGS. 1 and 2, the effective stroke length of the feed lever 4 is predetermined to correspond to the pitch required for feeding the electronic components 7 on the electronic components assembly 2 in each component feeder unit 1. A desired effective stroke of the feed lever 4 is set in such a way that the lower limit of the feed lever 4 is adjustably determined for each component feeder unit 1 by the lower dead point of the pressing roller 9, while the upper limit is uniformly set for all the component feeder units 1. The effective stroke length for the component feeder unit 1 where the pitch of feeding components is larger is determined to be greater by setting the lower limit of the feed lever 4 to a lower position (as shown by a double-dotted chain line denoting the vertical movement of the feed lever ② in FIG. 2). The effective stroke length for the component feeder unit 1 where the pitch of feeding components is smaller is determined to be shorter by setting the lower limit of the feed lever 4 to a higher position (as shown by a solid line denoting the vertical movement of the feed lever ① in FIG. 2). According to this embodiment, the pitch of feeding the components in the component feeder unit 1 can be determined by setting the lower limit of the movement of the pressing roller 9 during the operation of the electronic component feeding apparatus without preliminarily adjusting the upper limit of the feed lever as compared to the conventional apparatus.

When the component supply table 3 transfers the target component feeder unit 1 in the direction (a) according to a production program, the transmission mechanism 8 reads out the control data for the component feeder unit 1 and drives the linear servo motor 11 to determine a desired length of the pressing stroke.

Figure 6:
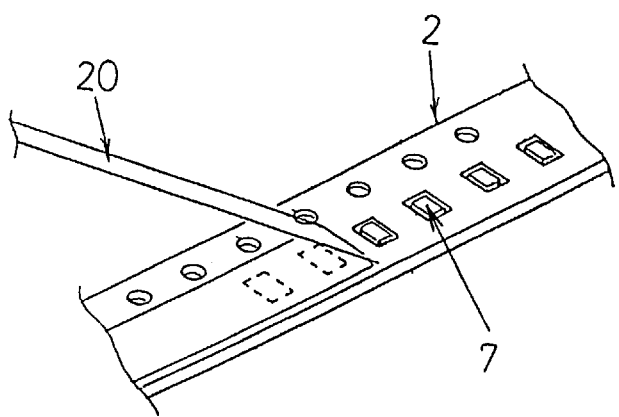
FIG. 6 is a perspective view showing an electronic components assembly.

As the pressing roller 9 is lowered and comes into contact with the contacting portion 16 of the feed lever 4 at its upper limit position, the feed lever 4 is pressed down by the stroke length to its lower limit position. The feed lever 4 is then returned upward by the yielding force of the spring together with the pressing roller 9 lifting up therewith, when the electronic components assembly 2 is advanced by the predetermined pitch in the direction (b). The electronic components assembly 2 is fed into a tape hold-down 5 after the covering tape 20 is peeled off therefrom by the separator 38 before the shutter 6 (FIG. 6). As shown in FIG. 2, the speed of the pressing roller 9 approaching the feed lever 4 is minimized by approximating the pressing stroke length to an effective stroke of the feed lever 4 for each component feeder unit 1.

The shutter 6 opens and closes linking with downward and upward movements of the feed lever 4, respectively. When the shutter 6 is opened, the nozzle C of the electronic component mounting apparatus B is lowered in response, and picks up an electronic component 7 positioned under the opened shutter 6 by a sucking action. The nozzle C is then lifted before the shutter 6 is closed and transfers the electronic component 7 to mount it on a printed circuit board A.

Figure 5:
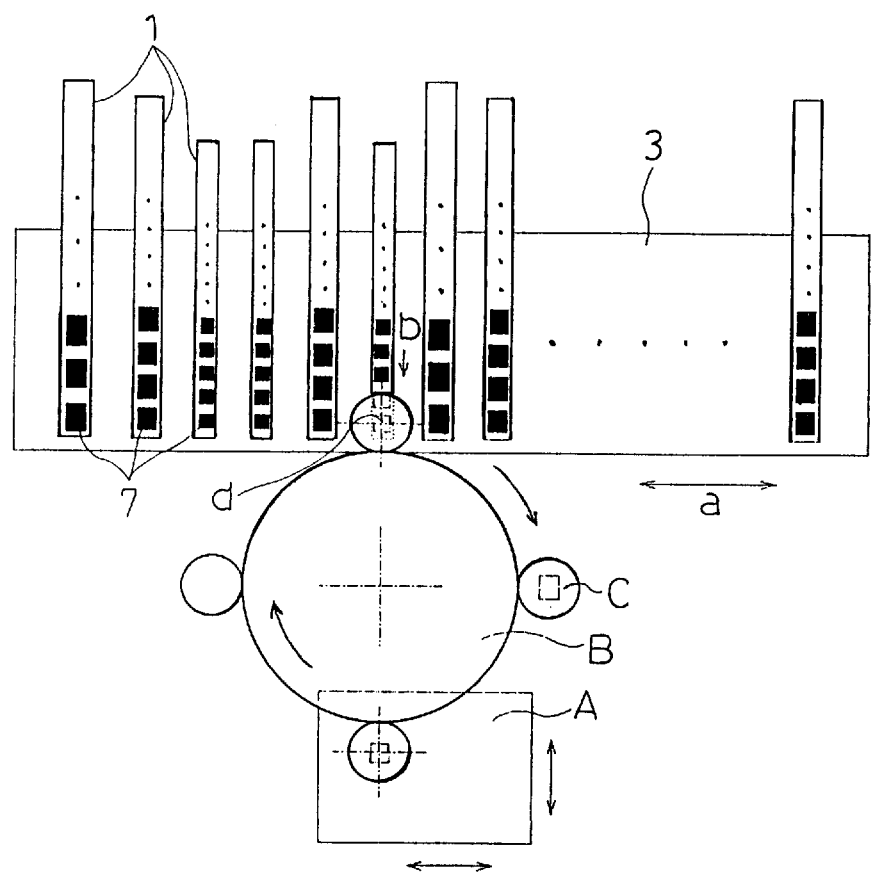
FIG. 5 is a schematic plan view showing an action of the conventional electronic component feeding apparatus.

While the pressing roller 9 stays at its upper dead point, the component supply table 3 conveys the succeeding component feeder unit 1 loaded with another type of electronic components 7 to the feeding position (d) as shown in FIG. 5. The transmission mechanism 8 identifies the succeeding component feeder unit 1 and determines the appropriate pressing stroke length corresponding to the effective stroke of the feed lever 4 for the component feeder unit 1. By repeating those actions, the electronic component feeding apparatus supplies groups of the electronic components 7 to the electronic component mounting apparatus B in accordance with a predetermined program.

The electronic component feeding apparatus of the present invention allows the pressing stroke length of the transmission mechanism to be adjusted to match the effective stroke of the feed lever for each component feeder unit. Accordingly, for the component feeder unit where the effective stroke of the feed lever is small, the speed of the pressing roller of the transmission mechanism approaching the contacting portion of the feed lever can be slowed down while the feeding speed remains unchanged, thus lowering the vibration caused by the impact. Accordingly, even with the component supply table carrying various types of component feeder units including the one containing smaller components fed at a smaller pitch which is susceptible to the vibration, the speed of feeding the components can be increased without raising any problems.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An electronic component feeding apparatus comprising:
    a plurality of component feeder units having respective feed levers, at least a feed level of one component feeder unit dispensing a series of electronic components at a predetermined pitch space between adjacent electronic components that is different than another component feed unit;
    a component feeder table for contacting and positioning a respective component feeder unit, to transfer an electronic component, at a transfer station:
    a component loader for picking up a transferred electronic component from the component feeder unit at the transfer station and dispensing the electronic component on to a mounting substrate; and
    a transmission mechanism operatively positioned at the transfer station for driving each of the feed levers of the component feeder units when said feed levers are respectively positioned at the transfer station including a reciprocating rotatable driving arm for operatively contacting each of the feed levers and means for varying a physical contact stroke of the driving arm with each feed lever to accommodate the predetermined pitch space between adjacent electronic components for each of the plurality of component feeder units.

2. The electronic component feeding apparatus of claim 1 wherein the transmission mechanism includes a force transmitting member that is movably mounted to the driving arm, means for mounting the driving arm for reciprocal movement about a pivot point and means for adjusting a relative position of the force transmitting member relative to the pivot point to vary the physical contact stroke of the driving arm with each feed lever.

3. The electronic component feeding apparatus of claim 2 wherein the means for adjusting the relative position includes a motor and means for providing control data to the motor consistent with a positioning of each feeder unit at the transfer station.

4. The electronic component feeding apparatus of claim 3 wherein the force transmitting member includes a cam and follower assembly to drive a rod member substantially traverse to a longitudinal axis of the driving arm.

5. A method of feeding an electronic component comprising the steps of:
    transferring one of a plurality of component feeder units to a component feeding position by a movement of a component feeder table in a direction of alignment of the component feeder units, some of said component feeder units respectively accommodating different pitch sizes of electronic components with a predetermined pitch space from the electronic components on other component feeder units, the electronic components on each component feeder unit are mounted on a respective tape carrier with the predetermined pitch space between adjacent electronic components;
    recognizing an electronic component accommodated in the component feeder unit that has been transferred to the component feeding position;
    determining an effective stroke of a feed lever of the component feeder unit such as to correspond with the predetermined pitch space between adjacent electronic components accommodated in the component feeder unit that has been transferred to the component feeding position; and
    controlling a transmission mechanism that provides a drive force with a swing motion to the feed lever of the component feeder unit to change a stroke of said swing motion so as to drive the feed lever with the determined effective stroke for the component feeder unit positioned at the component feeding position.

6. The method of feeding an electronic component according to claim 5, wherein the effective stroke of the feed lever of the component feeder unit is automatically determined and the transmission mechanism is controlled to change correspondingly the stroke of the swing motion thereof for driving the feed lever of the component feeder unit, as the component feeder units are successively positioned at the component feeding position one after another in accordance with a predetermined production program.

7. An electronic component feeding apparatus comprising:
    a plurality of component feeder units having respective feed levers, at least a feed lever of one component feeder unit dispensing a series of electronic components at a predetermined pitch space between adjacent electronic components that is different than another component feeder unit;
    a component feeder table for positioning the respective component feeder units to transfer an electronic component at a transfer station;
    a component loader for picking up a transferred electronic component and dispensing the electronic component on to a mounting substrate; and
    a transmission mechanism for driving each of the feed levers of the component feeder units at the transfer station including a common rotating reciprocating driving arm for operatively contacting each of the feed levers when each feed lever is positioned by the component feeder table at the transfer station and a pressing stroke controlling means for varying a stroke of the driving arm to accommodate the predetermined pitch space of adjacent electronic components for each of the plurality of component feeder units.

8. The electronic component feeding apparatus of claim 7 wherein the pressing stroke controlling means includes a memory means for storing, for each component feeder unit, a signal representative of a duration of contact of the common rotating reciprocating driving arm with a feed lever.

9. The electronic component feeding apparatus of claim 8 wherein the transmission mechanism includes a linear motor driven by the signal representative of the duration of contact.

10. An electronic component feeding apparatus comprising:
    a plurality of component feeder units having respective feed levers, at least a feed lever of one component feeder unit dispensing a series of electronic components at a predetermined pitch space between adjacent electronic components that is different than another component feeder unit;
    a component feeder table for positioning the respective component feeder units to transfer an electronic component at a transfer station;
    a component loader for picking up a transferred electronic component from the transfer station and dispensing the electronic component on to a mounting substrate; and a transmission mechanism for driving each of the feed levers of the component feeder units at the transfer station including a common rotating reciprocating driving arm for operatively contacting each of the feed levers when each feed lever is positioned by the component feeder table at the transfer station and a pressing stroke controlling means for automatically varying a stroke of the driving arm to change a lower limit contact position of the driving arm with the feed lever to accommodate the predetermined pitch space of adjacent electronic components for each of the plurality of component feeder units.

11. The electronic component feeding apparatus of claim 10 wherein the means for automatically varying a stroke of the driving arm includes a force transmitting member for driving the driving arm and a movable rod to vary a location of applying a driving force to the driving arm.

12. The electronic component feeding apparatus of claim 11 wherein the means for automatically varying a stroke of the driving arm includes a memory means for storing for each component feeder unit a signal representative of a duration of contact of the common rotating reciprocating driving arm with a feed lever.

13. The electronic component feeding apparatus of claim 12 wherein the transmission mechanism includes a linear motor driven by the signal representative of the duration of contact.

14. An electronic component feeding apparatus comprising:
- a set of component feeder units, aligned in parallel, having respective feed levers and electronic component assemblies, said electronic component assemblies respectively accommodating electronic components in a row on a carrier tape at predetermined pitch spaces between adjacent electronic components, and said feed levers being provided for conveying respective electronic components with a reciprocating motion of said feed lever, at least a pair of component feeder units have different pitch spaces from each other;
- a component feeder table which carries the set of component feeder units thereon and moves in a direction of alignment of the component feeder units so that the component feeder units can be transferred to a component feeding position; and
- a transmission mechanism means for driving the feed lever of the component feeder unit located at the component feeding position by a pressing action, the transmission mechanism means including a pressing stroke controller for automatically changing a stroke of a pressing action on a respective feed lever synchronously as the component feeder units are switched over, from one component feeder unit to another component feeder unit, by a movement of the component feeder table in the direction of alignment of the component feeder units such that the transmission mechanism means provides a matching drive force to a corresponding feed lever of the component feeder unit at the component feeding position to effect the reciprocating motion of the feed lever with an effective stroke for conveying the electronic component assemblies in the component feeder unit at a rate corresponding to a pitch space between adjacent electronic components accommodated in the component feeder unit which has been transferred to the component feeding position.

15. The electronic component feeding apparatus according to claim 14, wherein the transmission mechanism includes a driving arm that is swingably mounted around an axis and contacts at a distal end thereof with a feed lever of one of the component feeder units at the component feeding position for providing a driving force thereto with the reciprocating swing motion of the driving arm.

16. The electronic component feeding apparatus according to claim 15, wherein an effective stroke of the feed lever of a succeeding component feeder unit is determined while the driving arm of the transmission mechanism is positioned at an upper limit of the reciprocating swing motion of the driving arm.

17. The electronic component feeding apparatus of claim 14 wherein the transmission mechanism means includes a force transmitting member for driving a driving arm that contacts the corresponding feed lever, a motor and a movable rod in the driving arm that is driven by the motor to vary a location of applying the drive force from the force transmitting member to the driving arm.

18. The electronic component feeding apparatus according to claim 14, wherein the transmission mechanism means comprises:
- a driving arm pivotally mounted around an axis of rotation and having a pressing portion at a distal end thereof for pressing the feed lever,
- a rod supported in the driving arm in a direction orthogonal to said axis of rotation of the driving arm such as to be movable in an axial direction, and
- a drive force transmission device which includes a force rod that is operatively connected at one end thereof to the movable rod in the driving arm, and effects a swing motion of the driving arm around said axis of rotation by reciprocating movements thereof, wherein a stroke of swing motion of the driving arm is varied by changing a position of the movable rod in the driving arm along the axial direction.

19. An electronic component feeding apparatus, comprising:
- a plurality of component feeder units, each having respective feed levers for dispensing electronic components mounted on a carrier tape at a predetermined pitch space along a length direction of the carrier tape, the plurality of feeder units include a plurality of different pitch spaces;
- a component feeder table for moving the component feeder units to a component feeding position;
- a driving arm for contacting a feed lever to dispense an electronic component;
- a force transmitting member operatively connected to the driving arm to provide a pressing stroke of the driving arm on the feed lever; and
- a pressing stroke controlling means including a memory means for storing control data relative to the pitch space of each component feeder unit to adjust a relative position of the force transmitting member and the driving arm whereby the pressing stroke of the driving arm is made to match the pitch space of each component feeder unit.

20. In an electronic component feeding apparatus that has a component feeder table that supports a plurality of component feeder units having respective feed levers, at least a feed lever of one component feeder unit dispensing a series of electronic components at a predetermined pitch space between adjacent electronic components that is different than another component feeder unit, the component feeder table can selectively position a component feeder unit at a transfer station to transfer an electronic component to a component loader for picking up a transferred electronic component and dispensing the electronic component on to a mounting substrate, an improvement comprising:

a transmission mechanism, positioned at the transfer station and above the component feeder table, including a rotating reciprocating driving arm for operatively contacting a feed lever of a component feeder unit positioned at the transfer station by the component feeder table and below the rotating reciprocating driving arm; and a pressing stroke controlling means for varying a stroke of the driving arm to accommodate the predetermined pitch space between adjacent electronic components for each of the plurality of component feeder units, the pressing stroke controlling means includes a memory means for storing, for each component feeder unit, a signal representative of the pitch space of each component feeder unit to be positioned by the component feeder table at the transfer station and a motor, wherein the signal representative of the pitch space can cause the motor to be driven to vary a stroke of the rotating reciprocating driving arm to accommodate the pitch space of a current component feeder unit positioned at the transfer station.

21. The electronic component feeding apparatus of claim 20, wherein the rotating reciprocating driving arm supports the motor and a movable rod is driven by the motor, a force transmitting member is movingly connected to the movable rod and transmits a pressing force to the rotating reciprocating driving arm at a position determined by the signal representative of the pitch space.

* * * * *